United States Patent [19]

Fröhlich et al.

[11] Patent Number: 5,210,001

[45] Date of Patent: May 11, 1993

[54] PROCESS FOR THE PREPARATION OF IMAGES ON TONABLE, LIGHT-SENSITIVE LAYERS

[75] Inventors: Helmut Fröhlich, Heusenstamm, Fed. Rep. of Germany; Michael Fryd, Moorestown, N.J.

[73] Assignee: E. I. du Pont de Nemours and Company, Wilmington, Del.

[21] Appl. No.: 863,897

[22] Filed: Apr. 6, 1992

Related U.S. Application Data

[62] Division of Ser. No. 620,891, Dec. 3, 1990, Pat. No. 5,126,226.

[30] Foreign Application Priority Data

Dec. 15, 1989 [DE] Fed. Rep. of Germany ....... 3941446

[51] Int. Cl.$^5$ ............................................. G03C 1/82
[52] U.S. Cl. ................................... 430/252; 430/257; 430/292
[58] Field of Search ............... 430/257, 292, 293, 252, 430/253

[56] References Cited

U.S. PATENT DOCUMENTS

| | | | |
|---|---|---|---|
| 3,582,327 | 6/1971 | Boyd et al. | 96/28 |
| 3,620,726 | 11/1971 | Chu et al. | 96/27 R |
| 3,649,268 | 3/1972 | Chu et al. | 96/27 R |
| 4,215,193 | 7/1980 | Manger et al. | 430/291 |
| 4,243,741 | 1/1981 | Abele et al. | 430/270 |
| 4,304,836 | 12/1981 | Cheema et al. | 430/252 |
| 4,346,162 | 8/1982 | Abele | 430/270 |
| 4,356,253 | 10/1982 | Buzzell | 430/291 |
| 4,497,917 | 2/1985 | Upson et al. | 523/201 |
| 4,604,340 | 8/1986 | Grossa | 430/270 |
| 4,726,877 | 2/1988 | Fryd et al. | 156/630 |
| 4,748,102 | 5/1988 | Weller, Jr. et al. | 430/292 |
| 4,753,865 | 6/1988 | Fryd et al. | 430/281 |
| 4,806,451 | 2/1989 | Fröhlich | 430/291 |
| 4,892,802 | 1/1990 | Bauer et al. | 430/270 |
| 4,902,363 | 2/1990 | Delaney et al. | 156/230 |
| 4,939,029 | 7/1990 | Delaney et al. | 428/314.4 |
| 4,948,704 | 8/1990 | Bauer et al. | 430/291 |
| 5,001,034 | 3/1991 | Omote et al. | 430/292 |
| 5,055,329 | 10/1991 | Namiki et al. | 430/257 |
| 5,126,226 | 6/1992 | Frohlich et al. | 430/257 |

*Primary Examiner*—Jack P. Brammer

[57] ABSTRACT

A process for preparing images on a tonable, light-sensitive layer in which a transfer layer containing a toner and a core/shell polymer as a binder is used. The core polymer has a glass transition temperature above 50° C. and the shell polymer has a glass transition temperature below 40° C. Such transfer layers are used in proofing processes for high quality printing.

7 Claims, No Drawings

PROCESS FOR THE PREPARATION OF IMAGES ON TONABLE, LIGHT-SENSITIVE LAYERS

This is a division of application Ser. No. 07/620,891 filed Dec. 3, 1990, now U.S. Pat. No. 5,126,226.

FIELD OF INVENTION

This invention relates to a process for preparing images on tonable, light-sensitive layers and, in particular, to a color proofing process in which a transfer layer containing a toner and a core/shell polymer is used.

BACKGROUND OF THE INVENTION

The reprographic industry uses light-sensitive recording materials wherein differences in the tackiness of the exposed and unexposed areas are utilized for image production. For example, German Patents 12 10 321, 19 04 058, 19 04 059 and 20 04 214 disclose a reproduction process in which a tacky photopolymerizable recording material, consisting of a support and a photopolymerizable layer containing at least one addition-polymerizable monomer and a photopolymerization initiator, is hardened by imagewise exposure, whereby the exposed image areas lose their tackiness. The latent image is then visualized by applying a suitable toner, which adheres only to the unexposed tacky areas. Excess toner remaining on the exposed, non-tacky image areas is removed after application. This process produces positive, and optionally colored images of the original, and these images resemble in appearance images produced by the use of printing inks. Thus, the process has achieved considerable practical importance, particularly in the printing industry for proofing color separations.

Halftone color separations are used in reprography as copy originals for the preparation of offset or relief printing plates. The color separations are checked, prior to exposing the plate, with the aid of color proofing processes to determine whether the ultimate printing result will represent a tonally correct reproduction of the original. General standard specifications indicate that a resolution of 2%-98% dots at a screen spacing of 60 lines/cm is required for high quality offset printing. However it is particularly difficult to achieve satisfactory resolution of pointy 2% dots in the highlights and of 98% dots in the shadows. It is also of considerable importance for screen dots of the same size to be sharply defined and uniform over the entire surface to achieve good tonal value reproduction.

The above requirements can be met using the transfer materials described in German Patent 36 25 014 which utilizes a special binder system of incompatible polymers. However, these transfer materials still show deficiencies and disadvantages, particularly relative to their preparation.

The process for preparing the transfer materials described in German Patent 36 25 014 has several disadvantages. It is (1) time-consuming and costly; (2) a controllable layer structure is quite difficult to achieve; (3) it requires as a prerequisite, the preparation and storage of two different incompatible polymers; (4) the pigments must be milled separately; and (5) the dispersions must be mixed intensively during the entire preparation process to prevent the components from settling and clumping. Only then can a uniform coating on the support be assured. The coating rate must also be low, and this adversely affects the production process.

German Patent 29 49 462 discloses, pigmented layers containing 75-95 parts by weight pigment and 5-25 parts by weight of an elastomeric binder. The process produces high opacity images that are used preferably for the reproduction of text and display pieces. However, due to the high opacity, the process is not suitable for color proofing processes. Reduction of pigment content does lead to a lower density but it also causes a complete loss of resolution. In addition, pigmented transfer materials must be sufficiently frangible to rupture imagewise during transfer. Thus, after removal of the layer, only the tacky image areas of the recording material are toned by the adhering layer. The pigmented transfer layers should not be too delicate or show gross ruptures because handling latitude is not assured and flawless image reproduction is not possible.

Transfer layers have been developed using core/shell polymers. For example, European Patent 01 07 378 describes protective layers for photographic materials. The protective layers are formed from a polymer layer of a latex composition consisting of core/shell polymers with 80-95 percent by weight of a core polymer with a glass transition temperature above 70° C. and 5-20 percent by weight of a shell polymer with a glass transition temperature of 25°-60° C. The core/shell polymers described in Example 5 of European Patent 01 07 378 contain 40 percent by weight of a shell polymer having a glass transition temperature of 9° C. These polymers form delicate layers that show gross ruptures even if the layers are cast separately. The transfer layers must also contain a pigment, so that the core/shell polymers yield delicate layers susceptible to flaws on handling.

The use of core shell polymers as binder additives, fillers or matting agents in photopolymerizable materials is described in European Patent Application A3 02 03 936. The application describes swellable microgels with glass transition temperatures above 25° C. which are used to enhance the viscosity of photopolymerizable materials and to improve their storage stability. Core/shell polymers, among others, are described. The use of special core/shell polymers in pigmented transfer layers is not disclosed.

Accordingly, the object of the present invention is to provide a process for preparing images on tonable, light-sensitive layers by using a transfer layer which contains at least one toner. The process must be capable of achieving the resolution required by the printing industry. In addition, the process should provide highly uniform halftone values over the entire surface and avoid the previously described disadvantages and deficiencies.

It has been found that these objectives are achieved using special core/shell polymers for the preparation of pigmented transfer layers. Core/shell polymers comprising 5-95 percent by weight of a core polymer having a glass transition temperature above 50° C. and 5-95 percent by weight of a shell polymer having a glass transition temperature below 40° C. yield pigmented transfer materials of outstanding quality.

SUMMARY OF THE INVENTION

The invention relates to a process for preparing images on tonable, light-sensitive layers which comprises:

(a) imagewise exposing a light-sensitive layer so that tacky and non-tacky areas are produced;

(b) contacting the exposed layer with a light-insensitive transfer layer on a support, said transfer layer having:

(i) a binder containing at least one core/shell polymer wherein the core comprises 5-95 percent by weight of the polymer and has a glass transition temperature above 50° C. and the shell comprises 5-95 percent by weight of the polymer and has a glass transition temperature below 40° C.;
(ii) at least one toner; and
(c) separating the exposed layer from the transfer layer.

In another embodiment there is provided a process for preparing multi-color images.

DETAILED DESCRIPTION OF THE INVENTION

The process of the invention utilizes a transfer layer having at least one toner and a binder containing at least one core/shell polymer wherein the core comprises 5-95 percent by weight of the polymer and has a glass transition temperature above 50° C. and the shell comprises 5-95 percent by weight of the polymer and has a glass transition temperature below 40° C. The term toner as used herein means at least one finely divided powder or a combination of a finely divided powder and at least one dissolved dye.

The core/shell polymers used in the process of the invention are usually prepared in two steps by the emulsion polymerization method. In the first step, the monomer or monomer mixture is added to an 80° C. solution containing a polymerization catalyst and surfactants. The reaction is continued to complete polymerization. The monomer or monomer mixture for polymerizing the shell and new initiator is then added and polymerized. The resulting core/shell polymers consist of 5-95 percent by weight of a core polymer with a glass transition temperature above 50° C. and 5-95 percent by weight of a shell polymer with a glass transition temperature below 40° C. It is preferred that the core/shell polymer consist of 40-95 percent by weight of a core polymer having a glass transition temperature above 90° C., and 5-60 percent by weight of a shell polymer having a glass transition temperature below 20° C. Particularly preferred are those polymers having a relatively thin shell, i.e., 5-15 percent by weight of polymers with a glass transition temperature between −20° C. and 0° C. Shell polymers with higher glass transition temperatures i.e., 20° C. to 40° C., can be used, however, the thickness of the shell must be increased significantly relative to the core, preferably 50-95 percent by weight.

The glass transition temperature can be adjusted by selecting acceptable monomers or comonomers and their relative proportions. The core/shell polymers of the invention can be used individually or in combination with other core/shell polymers or with conventional binders.

Suitable core polymers include homopolymers or copolymers consisting of the following monomers and comonomers: methyl methacrylate, ethyl methacrylate, isopropyl methacrylate, butyl acrylate, 2-t-butylphenyl acrylate, 4-t-butylphenyl acrylate, 4-cyanophenyl acrylate, phenyl acrylate, benzyl methacrylate, 2-chloroethyl methacrylate, butyl methacrylate, 2-cyanoethyl methacrylate, cyclohexyl methacrylate, 2-hydroxyethyl methacrylate, 2-hydroxypropyl methacrylate, phenyl methacrylate, acrylic acid, methacrylic acid, acrylamide, methacrylamide, acrylonitrile, styrene, vinyl compounds, such as vinyl esters and vinyl chloride, vinylidene chloride, and butadiene, among others.

Homopolymers or copolymers can be formed as shell polymers from the monomers or comonomers given for the core and also from many other monomers. These include methyl acrylate, ethyl acrylate, hydroxyethyl acrylate, propyl acrylate, n-butyl acrylate, 2-ethylhexyl acrylate, benzyl acrylate, cyanobutyl acrylate, cyanoethyl acrylate, cyclohexyl acrylate, pentyl acrylate, hexyl acrylate, acrylic ester copolymers with acrylonitrile, n-butyl methacrylate, pentyl methacrylate and hexyl methacrylate.

Toners acceptable for image recording are well known in the art. For example, see German Patents 19 04 059 and 29 46 896. These toners are finely divided powders such as pigments, but dissolved dyes are also useful. Examples of finely divided powders include inorganic and organic pigments, fluorescent materials, metal powders in the pure form or combined with a powdered organic or inorganic carrier, such as titanium dioxide, silicon dioxide, glass powder, carbon (lampblack or graphite), metal phthalocyanines, azo dyes, metal powders of aluminum, copper, iron, gold, or silver, or metal oxides, and soluble organic dyes. The preparation of the layer is accomplished by methods well known in the art. However, in one preferred embodiment, the latex composition of the core/shell polymers is mixed with predispersed finely divided toner using conventional methods.

The toners can be applied by dusting the imagewise exposed surface with the toner. The toner can also be loosely bonded to a separate carrier and transferred by bringing the carrier into contact with the imagewise exposed layer. Thus, for example, German Patent 12 05 117 discloses the use of layers consisting of the toner material and optionally, a binder, coated on a support for thermal transfer processes.

The transfer layer is prepared as follows: the layer is first coated by known methods onto a suitable support and then dried. Suitable supports include synthetic resin films of polyesters, polyamides, polyethylene, polypropylene, and polyvinyl chloride. The thickness of the dried layer is less than 5 μm, and preferably less than 2 μm. A particularly preferred embodiment uses a polypropylene foam sheet in accordance with German OS 37 06 528 and a layer thickness of 1 μm as described in Example 6. The transfer may also contain other additives, such as surfactants, casting aids, agents to increase viscosity, and agents to improve adhesion. The use of fluorinated surfactants and high molecular weight polyethylene oxides to increase the viscosity of the layer formulation has proved to be particularly successful in practicing the instant invention.

The invention can be used for image production on most light-sensitive layers that can be modified into tacky and non-tacky areas by imagewise exposure. The light-sensitive layer can consist of positive as well as negative tonable systems. Suitable positive tonable systems are photohardenable, primarily, photopolymerizable systems such as those described in German Patents 12 10 321, 19 04 058, 19 04 059 and 20 04 214. The essential components of these photopolymerizable systems are one or more addition-polymerizable monomers, a binder or mixture of binders, and a photoinitiator or initiator system. Negative tonable systems are similarly known and described, for example, in German Patents 27 58 209, 30 23 247 and 34 29 615. The light-sensitive components of these systems are either a light-sensitive dihydropyridine compound or a light-sensitive system consisting of a dihydropyridine compound and a hexaaryl bis-imidazole compound.

The light-sensitive materials are most sensitive to the ultraviolet region, preferably to wavelengths between 250 and 450 nm. Therefore, radiation sources that emit an effective quantity of this radiation are suitable for practicing the invention. Suitable radiation sources include xenon lamps, mercury vapor and carbon arc lamps, lasers, fluorescent lamps with phosphors emitting UV radiation and electronic flash devices.

The process of the invention can be used for the reproduction of line and halftone photographs for use in graphic and other industry areas to make maps, printed advertisements, posters, luminous texts and to make printed circuits. However, a principal field of use is in the preparation of single or multi-color images and in utilization for color proofing processes.

In accordance with the present invention, there is provided, a process for preparing images on light sensitive layers which comprises:

(a) imagewise exposing a light-sensitive layer so that tacky and non-tacky areas are produced;

(b) contacting the exposed layer with a light-insensitive transfer layer on a support, said transfer layer comprising:

(i) a binder containing at least one core/shell polymer wherein the core comprises 5-95 percent by weight of the polymer and has a glass transition temperature above 50° C. and the shell comprises 5-95 percent by weight of a polymer and has a glass transition temperature below 40° C.;

(ii) at least one toner in the transfer layer's binder; and (c) separating the exposed layer from the transfer layer.

A light-sensitive element comprising a laminate of a photopolymerizable layer coated on a support, with a cover sheet, is applied, after removal of the cover sheet, onto an image receptor. The element is then exposed to actinic radiation through the transparent support with the use of a halftone color separation positive or negative, depending on whether it is a positive or negative working system, of a first color as the original to form tacky and non-tacky areas. The transfer layer is laminated onto the exposed layer and peeled off. A color image of the original is obtained. A second light-sensitive element is laminated, after removal of the cover sheet, onto the image, and is subsequently exposed under similar conditions through a halftone negative or positive color separation of a second color as the original. The transfer layer is laminated onto the exposed layer and then peeled off. The process is then repeated with a color separation of a third color and if desired, with a black separation. Thus, a four color image corresponding to the original can be obtained.

The instant invention is especially advantageous in that in starting with a positive working light-sensitive system, four-color overlays and a positive color proof therefrom can be prepared also from negative color separations as originals.

If negative color separations are the starting point, a proof is prepared first by the above process. The images remaining on the transfer layers used to transfer the separate colors are then laminated one over another using adhesive intermediate layers and applying pressure and/or heat for the preparation of the proof. The support is subsequently peeled off. In another embodiment, it is also possible to place the images remaining on the transfer layers one over another as an overlay proof.

In contrast to the transfer layers of German Patent 36 25 014, the transfer layers of the present invention are less time-consuming and more cost-effective and can be prepared with constant quality. In addition, a more uniform coating and a color layer with fewer thickness variations are obtained. Consequently, flawless transfer and high resolution are achieved. Thus, pigmented transfer layers having a controllable structure are obtained using the polymers of the instant invention.

The following examples illustrate the invention.

EXAMPLES

In the Examples below, the following abbreviations are used: MMA for methyl methacrylate, MAA for methacrylic acid, EA for ethyl acrylate, 2EHMA for 2-ethylhexyl methacrylate, AllylMA for allyl methacrylate and BuMA for butyl methacrylate.

EXAMPLE 1

Core/shell polymers A-E were prepared as follows: Polymer A was prepared by successively adding with stirring one eighth of monomer mixture 1 consisting of 324.5 g MMA, 17.5 g AllylMA, 7 g MMA, and 4.75 g of a 5% aqueous ammonium persulfate solution (solution B) to an 80°-85° C. solution of 9.4 g of 30% aqueous sodium lauryl sulfate and 1045 g deionized water (solution A). The remaining monomer mixture 1 was added to the reaction mixture within 90 minutes. The reaction mixture was then heated for 2.5 hours at 80°-85° C., and cooled to 40°-50° C. A solution containing 10 g of 30% aqueous sodium lauryl sulfate, 3.3 g of 5% aqueous ammonium persulfate and 1021 g deionized water (solution C) was added within 30 minutes. The reaction mixture was heated again to 80°-95° C. and monomer mixture 2 consisting of 181.3 g EA, 160.4 g MMA and 7 g MAA was added within 60 minutes. After two hours of heating at 85°-90° C., the reaction mixture was cooled to room temperature, and the polymer was filtered off, washed, and dried.

Polymers B-E were prepared according to the procedure used to prepare polymer A except that the following solutions were used:

a) Polymer B

Monomer Mixture 1 : 649 g MMA, 35 g AllylMA, 14 g MAA
Monomer Mixture 2 : 24.4 g 2EHMA, 10.6 g EA
Solution A : 2090 g water, 18.8 g 30% sodium lauryl sulfate solution
Solution B : 9.5 g 5% ammonium persulfate solution
Solution C : 1 g 30% sodium lauryl sulfate solution, 0.35 g 5% ammonium persulfate solution, 115 g water b) Polymer C

Monomer Mixture 1 : 324.5 g MMA, 17.5 g AllylMA, 7 g MAA
Monomer Mixture 2 : 146.5 g BuMA, 195.3 g EA, 7 g MAA
Solution A : 1045 g water, 9.4 g 30% sodium lauryl sulfate solution
Solution B : 4.75 g 5% ammonium persulfate solution
Solution C : 10 g 30% sodium lauryl sulfate solution, 3.3 g 5% ammonium persulfate solution, 1021 g water c) Polymer D

Monomer Mixture 1 : 324.5 g MMA, 17.5 g AllylMA, 7 g MAA

Monomer Mixture 2 : 236 g 2 EHMA, 105.6 g EA, 7 g MAA
Solution A : 1045 g water, 9.4 g 30% sodium lauryl sulfate solution
Solution B : 4.75 g 5% ammonium persulfate solution
Solution C : 10 g 30% sodium lauryl sulfate solution, 3.3 g 5% ammonium persulfate solution, 1021 g water d) Polymer E Monomer Mixture 1 : 1460.25 g MMA, 78.75 g AllylMA, 31.5 g MAA
Monomer Mixture 2 : 159.98 g 2EHMA, 71.55 g EA, 4.73 g MAA
Solution A : 4702 g water, 42.3 g 30% sodium lauryl sulfate solution
Solution B : 21.4 g 5% ammonium persulfate solution
Solution C : 6.75 g 30% sodium lauryl sulfate solution, 2.25 g 5% ammonium persulfate,776 g water

TABLE 1

| Polymer | | % | Monomers | % Monomers | Tg |
|---|---|---|---|---|---|
| A | core | 50 | MMA/AllylMA/MAA | 93/5/2 | +102° C. |
|   | shell | 50 | EA/MMA/MAA | 52/46/2 | +40° C. |
| B | core | 95 | MMA/AllylMA/MAA | 93/5/2 | +102° C. |
|   | shell | 5 | 2EHMA/EA | 70/30 | 15° C. |
| C | core | 50 | MMA/AllylMA/MAA | 93/5/2 | +102° C. |
|   | shell | 50 | BuMA/EA/MAA | 42/56/2 | 0° C. |
| D | core | 50 | MMA/AllylMA/MAA | 93/5/2 | +102° C. |
|   | shell | 50 | 2EHMA/EA/MAA | 68/30/2 | 15° C. |
| E | core | 87 | MMA/AllylMA/MAA | 93/5/2 | +102° C. |
|   | shell | 13 | 2EHMA/EA/MAA | 68/30/2 | 15° C. |

EXAMPLE 2

A layer formulation of the following composition was prepared to produce a transfer layer: 4.9 g of a dispersion of a finely divided cyan pigment was added slowly with stirring to 41.7 g of the 24.5 percent by weight latex of core/shell polymer A.

The following components were milled in a commercial dispersing mill for 1 hour at 5,000 rpm to produce the pigment dispersion:

| | |
|---|---|
| 80.2 g | deionized water |
| 3.9 g | sodium lauryl sulfate |
| 10.9 g | ethoxylated octyl phenol |
| 9.3 g | an alkali-neutralized copolymer of acrylic acid and an acrylate comonomer, as dispersing agent |
| 45.0 g | cyan pigment based on copper phthalocyanine (C.I. 74160) |

A solution of the following composition containing an agent to increase viscosity, a surfactant and a coating aid was then added with stirring to the layer formulation:

| | |
|---|---|
| 39.8 g | deionized water |
| 12.1 g | of a 2.25 percent by weight solution of polyethylene oxide, 2,000,000 average molecular weight |
| 1.2 g | anionic fluorinated surfactant |
| 6.3 g | of a second anionic fluorinated surfactant |

The layer formulation was then coated onto a polyethylene terephthalate sheet (25 μm) to produce, after drying, a 1 μm thick layer with a flawless surface without thickness variations.

A positive, tonable photopolymerizable layer made in accordance with Example 1 of U.S. Pat. No. 4,356,253 was laminated, after removal of the cover sheet, onto an image receptor and exposed through a halftone positive cyan color separation in a vacuum copying frame with a metal halide lamp (3,000 watts) and with an ultraviolet filter for 42 seconds at a 95 cm spacing.

The support was removed and the transfer layer containing the toning material was laminated onto the imagewise exposed layer and immediately peeled off. The transfer layer adhered only to the unexposed tacky areas and a positive cyan image of the original was obtained with a resolution of 2-98% dots in the 60 lines/cm screen.

EXAMPLE 3

A transfer layer was prepared using the following components:

41.7 g of the 24.5 percent by weight latex of core/shell polymer B was prepared. 4.9 g of a pigment dispersion prepared according to the procedure of Example 2 was added with stirring. The following solution was then added with stirring to the layer formulation:

| | |
|---|---|
| 12.1 g | of a 2.25 percent by weight polyethylene oxide solution, 2,000,000 average molecular weight |
| 40.6 g | deionized water and |
| 1.5 g | anionic fluorinated surfactants |

The layer formulation was coated onto a polyethylene terephthalate sheet (25 μm), and after drying, a 1 μm thick layer was obtained with a flawless surface and without thickness variations.

A color image was produced by laminating the transfer layer onto a photopolymerizable layer prepared and exposed according to Example 2 and peeling this transfer layer off. The colored transfer layer adhered only to the unexposed tacky areas and a positive cyan image of the original was obtained with a resolution of 2-98% dots in the 60 lines/cm screen.

EXAMPLE 4

A transfer layer was prepared from the following components:

4.9 g of a pigment dispersion was prepared according to the procedure of Example 2 and added with stirring to 41 7 g of the 24.5 percent by weight latex of core/shell polymer C. The following solution was added with stirring to the layer formulation:

| | |
|---|---|
| 12.1 g | 2.25 percent by weight polyethylene oxide, 2,000,000 molecular weight |
| 39.8 g | deionized water and |
| 1.5 g | anionic fluorinated surfactants |

The layer formulation was coated onto a polyethylene terephthalate sheet (25 μm) and a 1 μm thick layer was obtained after drying.

A colored image was produced by laminating the transfer layer onto a photopolymerizable layer prepared and exposed according to the procedure described in Example 2 and peeling this transfer layer off. A halftone image was not obtained. The layer remained on the base. Adhesion to the base and cohesion within the layer were too high.

EXAMPLE 5

A transfer layer was prepared using the following components:

4.9 g of a pigment dispersion was prepared in accordance with Example 2 and added with stirring to 41.7 g of the 24.5 percent by weight latex of core/shell polymer D. The following solution was added with stirring to the layer formulation:

| 12.1 g | 2.25 percent by weight polyethylene oxide, 2,000,000 molecular weight |
| --- | --- |
| 39.8 g | deionized water and |
| 1.5 g | anionic fluorinated surfactants |

The layer formulation was then coated onto a polyethylene terephthalate sheet (25 μm) and a 1 μm thick layer was obtained after drying.

A colored image was produced by laminating the transfer layer onto a photopolymerizable layer prepared and exposed according to the procedure described in Example 2 and peeling this transfer layer off. A halftone image was not produced. The coated composition remained on the base.

EXAMPLE 6

A transfer layer was prepared using the following components:

7.228 g of a dispersion of a finely divided cyan pigment was added slowly with stirring to 8.894 g of the 24.5 percent by weight latex of core/shell polymer E. The following solution was stirred in the mixture:

| 9.447 g | of water |
| --- | --- |
| 1.920 g | of a 2.25 percent by weight solution of polyethylene oxide, 100,000 average molecular weight |
| 1.920 g | of a 2.25 percent by weight solution of polyethylene oxide, 2,000,000 average molecular weight |
| 414 g | of a fluorinated surfactant and |
| 103 g | of a second fluorinated surfactant. |

The layer formulation was applied with a 70 lines/cm line screen at 20 m/min by reversible gravure printing onto a 60 μm thick polypropylene foam sheet in accordance with German OS 37 06 528. The layer was dried and an approximately 0.4 μm thick layer was obtained. The layer had a flawless surface and there were no thickness variations.

The sheet had an A-B-A structure, wherein the B core consisted of foamed polypropylene approximately 58 μm thick and the A layers each consisted of polypropylene copolymers approximately 1 μm thick, conferring a smooth surface on the entire sheet. One A side was rendered polar at approximately 36 dyn/cm by corona treatment. The layer formulation was then calendered onto this side.

A colored image was produced by laminating the transfer layer onto a photopolymerizable layer prepared and exposed in accordance with the procedure described in Example 2 and peeling this transfer layer off. The colored transfer layer adhered only to the unexposed tacky areas, and a positive cyan image of the original was obtained with a resolution of 2–98% dots in the 60 lines/cm screen.

EXAMPLE 7

A transfer layer was prepared using the following components:

4.9 g of a pigment dispersion was prepared in accordance with the procedure described in Example 2. The mixture was then added with stirring to 41.7 g of the 24.5 percent by weight latex of core/shell polymer E. A solution of the following components was added to the layer formulation:

| 12.1 g | 2.25 percent by weight polyethylene oxide, 2,000,000 molecular weight |
| --- | --- |
| 1.5 g | anionic fluorinated surfactant |
| 39.8 g | deonized water |

After thorough homogenization, the layer formulation was coated onto a polyethylene terephthalate sheet (25 μm), so that, after drying, a 1 μm thick layer was obtained with a flawless surface and without thickness variations.

A colored image was produced by laminating the transfer layer onto a photopolymerizable layer prepared and exposed in accordance with the procedure described in Example 2 and peeling this transfer layer off. The colored transfer layer adhered only to the unexposed tacky areas, and a positive cyan image of the original was obtained with a resolution of 2–98% dots on the 60 lines/cm screen.

EXAMPLE 8

A four-color image was prepared as follows: four transfer layers of cyan, magenta, yellow and black colors were prepared.

The following components were added with stirring to 500.4 g of the 24.5 percent by weight latex of core/shell polymer E:

| 145.2 g | 2.25 percent by weight polyethylene oxide, 2,000,000 molecular weight |
| --- | --- |
| 441.6 g | deionized water and |
| 14.4 g | anionic fluorinated surfactant #1 and |
| 3.6 g | anionic fluorinated surfactant #2. |

The layer formulation was divided into four samples (a–d) and the additives shown in Table 2 were added to the individual samples.

TABLE 2

| | (All values in g) | | | |
| --- | --- | --- | --- | --- |
| Additives | Sample (a) Cyan | Sample (b) Magenta | Sample (c) Yellow | Sample (d) Black |
| Pretreated pigment dispersion in accordance with Example 1 | 23.7 | 23.7 | 23.7 | 23.7 |

The pigments were milled in accordance with the procedure described in Example 1.

A mixture of a cyan pigment based on copper phthalocyanine (C.I. 74160) and magenta pigment (C.I. Pigment Red 123) was used as the pigment for preparing the cyan transfer layer. A mixture of two magenta pigments (C.I. Pigment Red 122 and Pigment Red 123) was used for the magenta transfer layer. The color pigment C.I. Pigment Yellow 17 was used for the yellow transfer layer. The transfer layer for black contained C.I. Pigment Black 7.

After thorough homogenization, the layer formulations (a–d) were then coated onto a polyethylene terephthalate sheet (25 μm), so that, after drying, a 1 μm thick colored layer was obtained with a flawless surface and without thickness variations.

The color densities of the individual layers were:

| Cyan: | 1.39 |
|---|---|
| Magenta: | 1.40 |
| Yellow: | 1.30 |
| Black: | 1.80 |

A four-color proof was produced by first preparing a positive, tonable, photopolymerizable layer in accordance with the procedure described in Example 1 of U.S. Pat. No. 4,356,253. The cover sheet was removed and the photopolymerizable layer was laminated onto an image receptor and exposed through a halftone, positive cyan color separation in a vacuum copying frame with a metal halide lamp (3000 watts) and with the use of an ultraviolet filter for 42 seconds at a spacing of 95 cm. The support was removed and transfer layer (a) containing pigment was laminated onto the imagewise exposed layer and immediately peeled off. The transfer layer adhered only to the unexposed tacky areas and a positive cyan image of the original was obtained.

A second positive, tonable, photopolymerizable recording material was laminated onto the cyan image and exposed through the corresponding halftone magenta color separation. The support was removed and transfer layer (b) containing pigment was laminated onto the imagewise exposed layer and peeled off. The transfer layer adhered only to the unexposed tacky areas and a positive magenta image was obtained. The processing steps were repeated for the yellow and black colors and a protective layer was coated in the usual manner. A four-color proof print of outstanding brilliance and sharpness was obtained with a resolution of 2–98% dots on the 60 lines/cm screen, representing a lifelike reproduction of the original.

What is claimed is:

1. A process for preparing images on tonable, light-sensitive layers which comprises:
   (a) imagewise exposing a light-sensitive layer so that tacky and non-tacky areas are produced;
   (b) contacting the exposed layer with a light-insensitive transfer layer on a support, said transfer layer having:
      (i) a binder containing at least one core/shell polymer wherein the core comprises 5–95 percent by weight of the polymer and has a glass transition temperature above 50° C. and the shell comprises 5–95 percent by weight of a polymer and has a glass transition temperature below 40° C.;
      (ii) at least one toner; and
   (c) separating the exposed layer from the transfer layer.

2. A process according to claim 1 wherein the core/shell polymer comprises 5–50 percent by weight of a shell polymer having a glass transition temperature below 20° C.

3. A process according to claim 1 wherein the core/shell polymer comprises 5–15 percent by weight of a shell polymer having a glass transition temperature below 0° C.

4. A process according to claim 1 wherein the core/shell polymer comprises 50–95 percent by weight of a shell comprises polymer having a glass transition temperature between 20° and 40° C.

5. A process according to claim 1 wherein the core of the core/shell polymer comprises 40–95 percent by weight of the polymer.

6. A process according to claim 1 wherein the core of the core/shell polymer has a glass transition temperature above 90° C.

7. A process according to claim 1 wherein a tonable, light sensitive photopolymerizable layer containing at least one photopolymerizable monomer, a photoinitiator or initiator system and a binder or mixture of binders is used.

* * * * *